United States Patent [19]

Kim et al.

[11] Patent Number: 5,067,109
[45] Date of Patent: Nov. 19, 1991

[54] DATA OUTPUT BUFFER CIRCUIT FOR A SRAM

[75] Inventors: Byeong-Yun Kim, Seoul; Tae-Sung Jung, Buchun; Yong-Bo Park, Busan, all of Rep. of Korea

[73] Assignee: Samsung Semiconductor & Telecommunications Co., Ltd., both of Gumi, Rep. of Korea

[21] Appl. No.: 238,247

[22] Filed: Aug. 30, 1988

[30] Foreign Application Priority Data

Aug. 31, 1987 [KR] Rep. of Korea .............. 87-9589[U]

[51] Int. Cl.$^5$ .............................................. G11C 8/00
[52] U.S. Cl. ............................... 365/189.05; 307/443
[58] Field of Search .............. 365/189.05, 230.08; 307/530, 450, 443, 448

[56] References Cited

U.S. PATENT DOCUMENTS 4,644,505 2/1987 Mahmood ............... 365/230.08
4,719,602 1/1988 Hag et al. ............... 365/189.05

OTHER PUBLICATIONS

"Two 13-ns 64K CMOS SRAM's with Very Low Active Power and Improved Asynchronous Circuit Techniques"; Stephen T. Flannagan et al.; IEEE Journal of Solid-State Circuits, vol. SC-21, No. 5, Oct. 1986, pp. 692-703.
ISSCC 87/Friday, Feb. 27,1987/Grand Ballroom West-/Fam 19.7-1 page.

Primary Examiner—Joseph A. Popek
Attorney, Agent, or Firm—Cushman, Darby & Cushman

[57] ABSTRACT

For a SRAM having a sense amplifier amplifying memory data and a read/write control circuit controlling operations of the sense amplifier, a data output buffer circuit is provided, which includes: a drive output node from which data output buffer provides output data; a first circuit providing a NOR function of an SAS signal from the sense amplifier and an output enable signal (OE) from the read/write control circuit; a second circuit providing a NOR function of an $\overline{SAS}$ signal from the sense amplifier and the output enable signal (OE) from the read/write control circuit; a third circuit eliminating noise produced by transition in the outputs of the first and second circuit and also enhancing a response time; a fourth circuit inverting the output of the first circuit; a fifth circuit inverting twice, sequentially, the output of the second circuit; and a sixth circuit responsive to the fourth and fifth circuit, alternatively providing, depending on the SAS and an SAS signal from the sense amplifier, one of three states on the drive output node: a first and second output state, and a third high impedance state. None of the first, second, third, fourth, fifth, and sixth circuit requires use of a single pulse output signal externally provided to the data output buffer circuit. During transition from the first state to the second state, the drive output node passes through the third high impedance state.

5 Claims, 3 Drawing Sheets

DATA OUTPUT BUFFER CIRCUIT FOR A SRAM

BACKGROUND OF THE INVENTION

This invention relates to a data output buffer of a static random access memory (SRAM) and more particularly to a data output buffer of SRAM with a high impedance output driver stage.

Recently, there have been design approaches for higher speed and for lower power consumption of the SRAM. According to this tendency, in making a SRAM, the delay time of the data output buffer matters in the portion of the access time of the memory. However, there is a bad influence resulting from earthed voltage noise ($V_{SS}$ Noise) or $V_{CC}$ Noise (Power Supply Voltage Noise) by the peak current at the time of reading data of two opposite states sequentially more than twice, i.e., the voltage of input-output being changed from high to low or from low to high.

FIG. 1 shows a schematic diagram of a data output buffer in a general SRAM. At first, the output SAS, $\overline{SAS}$ of a sensing amplifier SA which differentially amplifies data of bit lines BL, $\overline{BL}$ are equalized with the middle level between low and high state, and then they are split to the state of high or low according to the data of the bit lines BL, $\overline{BL}$ which perceive a memory cell. Then, data are offered through a data buffer DB controlled by a read-write control buffer R/WB.

FIG. 2 shows the circuit diagram of a conventional data output buffer. The output SAS of a sense amplifier and the single pulse out signal $\phi_{PZ3}$ of a single pulse generator which is combinating short pulses resulting from transition of external address signals, are connected to the input terminal of a NAND gate $NA_1$, and the output terminal of said signal pulse generator $\phi_{PZ3}$ is connected to the gate of a NMOS transistor $T_{21}$ and a inverter $N_3$.

The output terminal of said inverter $N_3$ is connected to the gate of a PMOS transistor $T_{20}$ and the drains of said PMOS transistor $T_{20}$ and NMOS transistor $T_{21}$ are connected to the output terminal of said NAND gate $NA_1$.

A latch composed of inverters $N_1$, $N_2$ is connected to the source of the transistors $T_{20}$, $T_{21}$, and the output terminal of the inverter $N_1$ is connected to input terminals of a NAND gate $NA_2$ and NOR gate $NO_1$, respectively. And the output signal $\overline{OE}$ of the read/write control buffer R/WB is inputted to the NOR gate $NO_1$, and the NAND gate $NA_2$ through the inverter $N_9$. The output terminal 50 of the NOR gate $NO_1$ is connected to the inverters $N_6$, $N_8$, and the output terminal 40 of the NAND gate $NA_2$ is connected to inverters $N_4$, $N_7$.

The output terminal 70 of the inverter $N_8$ is connected to the gate of a NMOS transistor $T_2$; the output terminal 60 of the inverter $N_7$ is connected to a PMOS transistor $T_{22}$; the drain of said PMOS transistor $T_{22}$ is connected to the power supply $V_{CC}$; the source of said NMOS transistor $T_{23}$ is grounded, and the source of the PMOS transistor $T_{22}$ and the drain of the NMOS transistor $T_{23}$ are connected at point 80 point 80 is connected to the data input-output terminal.

FIG. 3 shows the operational waveforms of FIG. 2, in which:

3a shows the output signal SAS of the sense amplifier SA, 3b shows the single pulse output signal $\phi_{PZ3}$, 3c shows the output signal of the NAND gate $NA_1$, 3d shows the signal at the input terminal 20 of the inverter $N_1$, 3e shows the output signal at the output terminal 30 of the inverter $N_1$, 3f shows the output signal at the output terminal 40 of the NAND gate $NA_2$, 3g shows the output signal at the output terminal 60 of the inverter $N_7$, 3h shows the output signal at the output terminal 50 of the NOR gate $NO_1$, 3i shows the output signal at the output terminal 70 of the inverter $N_8$, and 3j shows the output signal of the output drive terminal 80.

The operation of the conventional data output buffer is described below with reference to FIG. 2 and FIG. 3.

During a read cycle, the output enable signal $\overline{OE}$ is low, and the output signal SAS of the sense amplifier SA is equalized with the middle level between the high and low level. If there are data which come from the memory cell, the state becomes high or low level. When the output signal SAS of the sense amplifier SA is an enough high level like the waveform as shown in FIG. 3a, the single pulse output signal $\phi_{PZ3}$ goes to a high state for a given moment.

When a single pulse output $\phi_{PZ3}$ is transmitted to high, the output signal at output terminal 10 of the NAND gate $NA_1$ goes to a low state as shown in FIG. 3c, and this signal goes to a high state when $\phi_{PZ3}$ is low. Then the control signal 3b of the single pulse output signal $\phi_{PZ3}$ switches the P, N MOS transistors $T_{20}$, $T_{21}$, and the output of node 20 goes to a low state. This signal is latched in the latch circuit composed of the two inverters $N_1$, $N_2$. Because said output enable signal $\overline{OE}$ is in a low state, the output of the inverter $N_9$ goes to high state and this signal is inputted to the NAND gate $NA_2$ with the signal shown by FIG. 3e.

The output signal waveform at the output terminal 40 of the NAND gate $NA_2$ is shown in FIG. 3f. Through the inverters $N_4$, $N_7$, this signal goes to a low output state and this output turns on the PMOS transistor $T_{22}$. The output of the NOR gate $NO_1$ is at a low state as shown in FIG. 3e, and through the inverters $N_6$, $N_8$, this signal goes to a low state as shown in FIG. 3i. Finally the NMOS transistor $T_{23}$ becomes off and the output at the node 80 becomes a high state as shown in FIG. 3j.

Since said data output buffer circuit has a complex composition because of the multiplicity of gates, and the signal trip time from the sense amplifier SA to the driver output terminal 80 is so long that the speed is reduced.

As a property of the memory, general output driver transistors $T_{22}$, $T_{23}$ are large in size. Because of that size, peak currents resulted from the direct current path which is broken out in transistions of outputs cause a problem of $V_{CC}$ Noise and $V_{SS}$ Noise.

SUMMARY OF THE INVENTION

It is an object of this invention to provide a data output buffer for a SRAM, having a reduced number of gates for enhancing data access time by minimizing trip time.

It is another object of the invention to provide a data output buffer for a SRAM, having a small output swing and not making a direct current path through a third state at the time of data transition.

It is a further object of the invention is to provide a data output buffer for a SRAM, wherein $V_{CC}$ and $V_{SS}$ noise are minimized.

It is still another objective of the invention to achieve any one or more of the foregoing objectives.

For a SRAM having a sense amplifier which amplifies memory data and a read/write control circuit which controls operations of the sense amplifier, a data output buffer circuit is provided. The data output buffer circuit includes a drive output node from which the data output buffer circuit provides output data, and a means for generating a high impedance state on the drive output node, without requiring use of a single pulse output signal externally provided to the generating means. The generating means is responsive to an SAS signal and an $\overline{SAS}$ signal provided by the sense amplifier.

DETAILED DESCRIPTION OF THE PREFERRED EMBODIMENT

Figure 4:
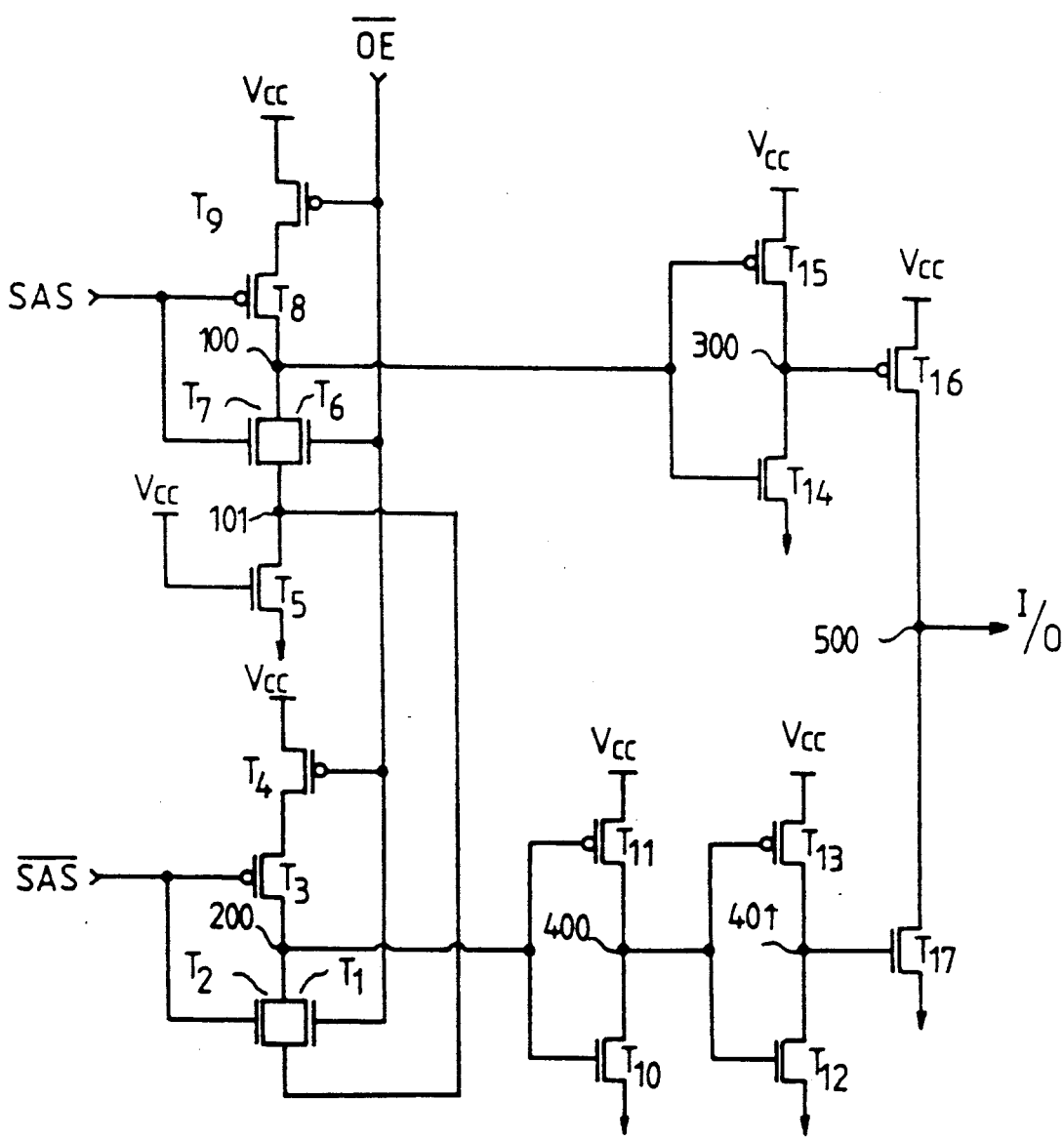
FIG. 4 is a circuit diagram according to this invention.

FIG. 4 is a circuit diagram according to one embodiment of the present invention.

The configuration of a first circuit providing a NOR function is as follows. An output signal SAS of a sense amplifier SA is inputted to the gates of a PMOS transistor $T_8$ and a NMOS transistor $T_7$; the drain of said PMOS transistor $T_8$ is connected to the source of a PMOS transistor $T_9$, and the gates of the PMOS transistor $T_9$ and a NMOS transistor $T_6$ are connected to an output enable terminal $\overline{OE}$. The source of said PMOS transistor $T_8$ is connected to the output node 100; the drains of said NMOS transistors $T_6$, $T_7$ are also connected to the output node 100, and the sources of the transistors $T_6$, $T_7$ are connected to node 101 as is a NMOS transistor $T_5$.

A third circuit to enhance a response speed and to eliminate noise is composed of the transistor $T_5$ by way of connecting the gate thereof to a power supply $V_{CC}$ and grounding the source thereof.

The configuration of a second circuit providing a NOR function is as follows.

An inverted signal $\overline{SAS}$ of the sense amplifier SA is inputted to the gates of a P and N MOS transistors $T_3$, $T_2$ respectively. The gates of a PMOS transistor $T_4$ and NMOS transistor $T_1$ are connected to said output enable terminal $\overline{OE}$, and the source of said PMOS transistor $T_4$ and the drain of NMOS transistor $T_3$ are connected. The source of the PMOS transistor $T_3$ is connected to the drains of two NMOS transistors $T_1$, $T_2$ at a node 200 and the sources thereof are connected to a node 101.

A fourth circuit which inverts the output of the first circuit is composed of two transistors $T_{14}$, $T_{15}$. The gates of PMOS transistor $T_{15}$ and NMOS transistor $T_{14}$ are connected to the node 100; the drain of the PMOS transistor $T_{15}$ is connected to a power supply $V_{CC}$; the source of the NMOS transistor $T_{15}$ is grounded; a source node 300 of PMOS transistor $T_{15}$ is connected to the drain of the NMOS transistor $T_{14}$.

The configuration of a fifth circuit which invert twice an output of the second circuit is as follows.

The node 200 is connected to the gates of a PMOS transistor $T_{11}$ and a NMOS transistor $T_{10}$; the drain of the PMOS transistor $T_{11}$ is connected to a power supply $V_{CC}$, and the source of the NMOS transistor $T_{10}$ is grounded. A source node 400 of the PMOS transistor $T_{11}$ is connected to the drain of the NMOS transistor $T_{10}$, and it is connected to the gates of a PMOS transistor $T_{13}$ and a NMOS transistor $T_{12}$. The drain of the NMOS transistor $T_{13}$ is connected to a power supply $V_{CC}$, and the source of the NMOS transistor $T_{14}$ is grounded. A source node 401 of the PMOS transistor $T_{13}$ is connected to the drain of the NMOS transistor $T_{12}$.

A sixth circuit is composed of transistor $T_{16}$, $T_{17}$. The gate of the NMOS driver transistor $T_{17}$ is connected to the node 401; the gate of the PMOS driver transistor $T_{16}$ is connected to the node 300; and an output is derived at a node 500 connected between the source of the PMOS transistor $T_{16}$ and the drain of the NMOS transistor $T_{17}$. The drain of the PMOS transistor $T_{16}$ is connected to a power supply $V_{CC}$ and the source of the NMOS transistor $T_{17}$ is grounded.

Figure 1:
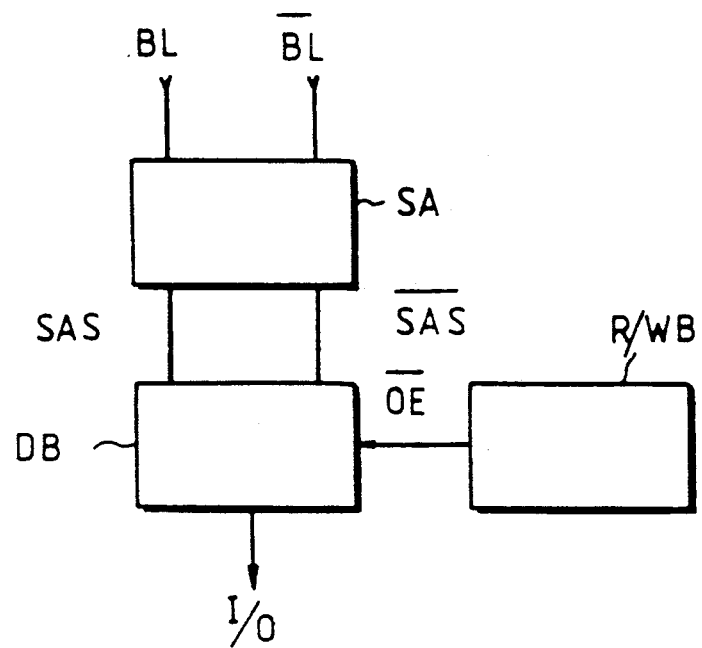
FIG. 1 is a schematic block diagram of a data output buffer for a general SRAM.
Figure 2:
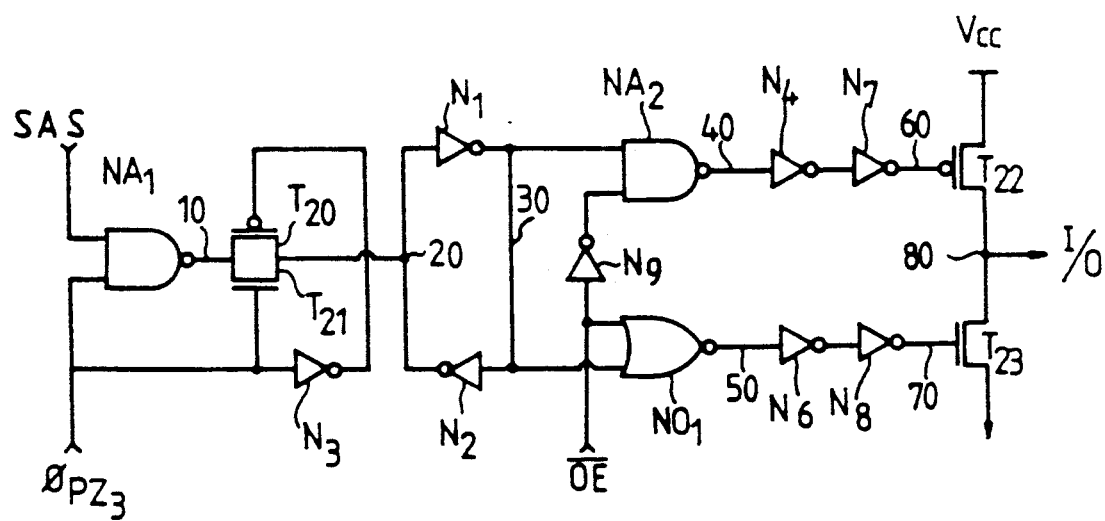
FIG. 2 is a conventional data output buffer circuit.
Figure 3:
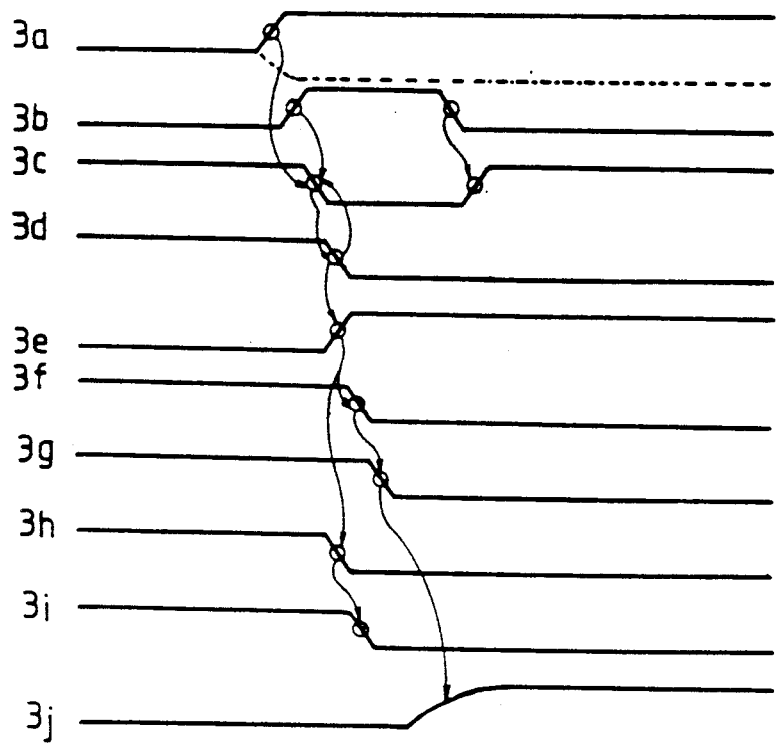
FIG. 3 shows operational waveforms of the circuit of FIG. 2.
Figure 5:
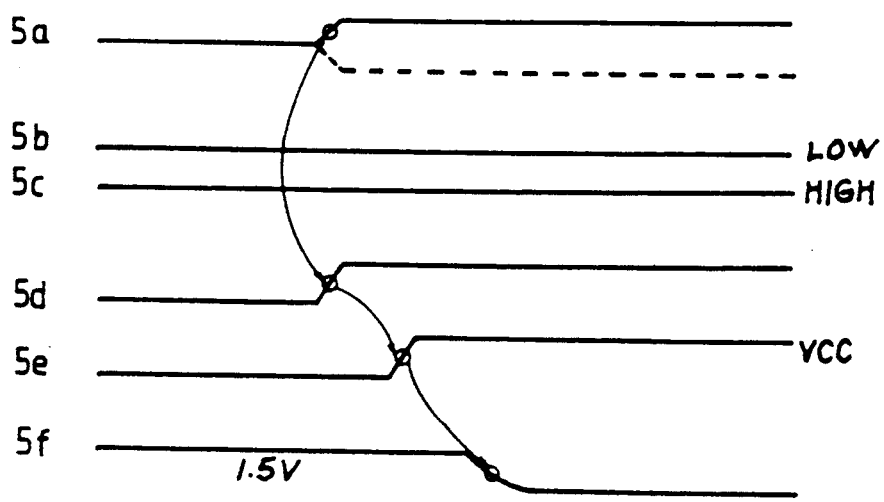
FIG. 5 shows operational waveforms of FIG. 4 according to this invention.

FIG. 5 shows the operational waveforms of various signals in FIG. 4, according to the present invention, in which:

5a is output signals SAS, $\overline{SAS}$ of sense amplifier SA, 5b is an output signal of the node 100, 5c is an output signal of the node 300, 5d is an output signal of the node 200, 5e is an output signal of the node 401, and 5f is an output signal of the node 500.

Then, operation of the circuit diagram of the present invention will be described with reference to FIG. 4 and FIG. 5. The output signals SAS, $\overline{SAS}$ of the sense amplifier are equalized before there are date output from a memory cell. The equalization level is high enough to be recognized as "HIGH" by the first and second means. So in this case, the PMOS transistor $T_{15}$ is in ON state and the PMOS transistor $T_{16}$ is in OFF state as shown in FIG. 5, 5a. On the other hand, the PMOS transistor $T_{11}$ is in ON state and the NMOS transistor $T_{17}$ is in OFF state. Accordingly, the driver output becomes a high impedance state by the OFF states of transistors $T_{16}$, $T_{17}$, that is, becomes a middle state between a low and high state. And the voltage level of this state is about 1.5 V.

When a data output is derived from the memory cell as shown in FIG. 5, 5a, the NMOS transistor $T_7$ becomes on in the case of the sense amplifier output SAS being high. Since the NMOS transistor $T_5$ is in ON state, the node 100 becomes a low state and the NMOS transistor $T_{14}$ remains an OFF state. So the output of node 300 becomes a high state as shown in FIG. 5, 5c and the PMOS transistor $T_{16}$ is in OFF state. On the other hand, a low $\overline{SAS}$ signal as shown in FIG. 5, 5a turns the PMOS transistor $T_3$ on; since the PMOS transistor $T_4$ by means of the enable signal $\overline{OE}$ is also ON, the node 200 becomes a high state and NMOS transistor $T_{10}$ becomes on. As a result, the PMOS transistor $T_{13}$ becomes high state as shown in FIG. 5, 5e. The NMOS transistor $T_{17}$ becomes on by the high state output of the node 401; so the output state of node 500 is low as shown in FIG. 5, 5f.

If output signals SAS, $\overline{SAS}$ of the sense amplifier SA are inverted into a low and high state, the PMOS transistor $T_{16}$ in the driver terminal becomes on; the NMOS transistor $T_{17}$ becomes off; and the node 500 of the driver output terminal will be placed in a high state. Before drive output node 500 goes to the high state, however, it goes to a third state at the moment the output signals SAS, $\overline{SAS}$ of the sense amplifier SA are equalized before their complete inversion into the low and high state. The third state is a high impedance state, and the drive output node is placed in that third state when the sense amplifier outputs are equalized prior to a complete inversion. When the output signals SAS, $\overline{SAS}$ are inverted, the driver output will be placed in the high state after a little delay in the inverter circuit. So the driver output has three states: low, high and middle.

As described above, the drive output node 500 will be made to have a high impedance, by use of output signal SAS, $\overline{SAS}$ of sense amplifier SA without the extra single pulse output signal $\phi_{PZ3}$, for transition of data.

According to the present invention, because the data output buffer circuit has few gates, a high data process speed can be obtained without any cirtical signal delay. Operation speed can be enhanced by the middle state in the transition. In addition, since the driver output goes through low, middle and high states, there is no current path to consume dummy power and there is no increase of a peak current. Accordingly, minimization of $V_{CC}$ and $V_{SS}$ noise can be obtained.

What is claimed is:

1. For an SRAM having a sense amplifier which amplifies memory data and a read/write control circuit which controls operations of said sense amplifier, a data output buffer circuit comprising:
   a drive output node from which said data output buffer circuit provides output data; and
   means for generating a high impedance state on said drive output node in response to a first signal (SAS) and a second signal ($\overline{SAS}$) provided by said sense amplifier, said second signal ($\overline{SAS}$) being an inversion of said first signal (SAS); said generating means comprising:
   (a) first means for providing a NOR function of the SAS signal and an output enable signal (OE) from said read/write control circuit;
   (b) second means for providing a NOR function of the $\overline{SAS}$ signal and the output enable signal (OE) from said read/write control circuit;
   (c) third means connected to said first and second means for eliminating noise produced by transition in the output of said first and second means and for enhancing a response time;
   (d) fourth means for inverting the output signal of said first means;
   (e) fifth means for inverting twice, sequentially, the output of said second means; and
   (f) sixth means responsive to said fourth and fifth means, for providing said high impedance state on said drive output node.

2. For an SRAM having a sense amplifier which amplifies memory data and a read/write control circuit which controls operations of said sense amplifier, a data output buffer circuit comprising:
   a drive output node from which said data output buffer circuit provides output data; and
   means for generating, alternatively, a first output state, a second output state, and a third high impedance state on said drive output node in response to a first signal (SAS) and a second signal ($\overline{SAS}$) provided by said sense amplifier, said second signal ($\overline{SAS}$) being an inversion of said first signal (SAS); said generating means comprising:
   first means for providing a NOR function of the SAS signal and an output enable signal (OE) from said read/write control circuit;
   second means for providing a NOR function of the $\overline{SAS}$ signal and the output enable signal (OE) from said read/write control circuit;
   third means connected to said first and second means for eliminating noise produced by transition in the outputs of said first and second means and for enhancing a response time;
   fourth means for inverting the output signal of said first means;
   fifth means for inverting twice, sequentially, the output of said second means; and
   sixth means responsive to said fourth and fifth means for providing said first state, second state, and third high impedance state, alternatively, on said drive output node.

3. A data buffer output circuit as recited in claim 2, wherein:
   said drive output node passes through said third high impedance state during transition between said first and second output state.

4. For a SRAM having a sense amplifier which amplifies memory data and a read/write control circuit which controls operations of said sense amplifier, a data output buffer circuit comprising:
   a drive output node from which said data output buffer circuit provides output data;
   first means for providing a NOR function of a first signal (SAS) from said sense amplifier and an output enable signal (OE) from said read/write control circuit;
   second means for providing a NOR function of a second signal ($\overline{SAS}$) from said sense amplifier and the output enable signal (OE) from said read/write control circuit, said second signal ($\overline{SAS}$) being an inversion of said first signal (SAS);
   third means connected to said first and second means for eliminating noise produced by transition in the outputs of said first and second means and for enhancing a response time;
   fourth means for inverting the output signal of said first means;
   fifth means for inverting twice, sequentially, the output of said second means; and
   sixth means responsive to said fourth and fifth means for alternatively providing, depending on said first and second signals, one of three states on said drive output node: a first output state, a second output state, and a third high impedance state.

5. A data buffer output circuit as recited in claim 4, wherein:
   said drive output node passes through said third high impedance state during transition between said first and second output state.

* * * * *